United States Patent [19]

Hiroe

[11] Patent Number: 5,068,526
[45] Date of Patent: Nov. 26, 1991

[54] PHOTOELECTRIC CONVERSION DEVICE WITH VOLTAGE SOURCE MEANS
[75] Inventor: Akihiko Hiroe, Fujisawa, Japan
[73] Assignee: Ricoh Company, Ltd., Tokyo, Japan
[21] Appl. No.: 580,966
[22] Filed: Sep. 12, 1990
[30] Foreign Application Priority Data Sep. 13, 1989 [JP] Japan .................................. 1-238870

[51] Int. Cl.$^5$ ............................................. H01J 40/14
[52] U.S. Cl. .............................. 250/214 R; 250/208.1
[58] Field of Search ............. 250/208.1, 214 R, 211 J; 358/482, 483, 213.31, 213.27, 213.28, 458, 455, 456, 461; 307/311

[56] References Cited

U.S. PATENT DOCUMENTS

| 3,770,967 | 11/1973 | Hanna et al. | 250/214 R |
|---|---|---|---|
| 4,423,958 | 1/1984 | Schmitt | 250/214 R |
| 4,551,623 | 11/1985 | Elliott et al. | 250/214 R |
| 4,839,739 | 6/1989 | Tachiuchi et al. | 358/482 |
| 4,866,291 | 9/1989 | Shimada et al. | 250/208.1 |
| 4,935,618 | 6/1990 | Naito | 250/214 R |
| 4,945,226 | 7/1990 | Fukuda et al. | 250/214 R |
| 4,977,304 | 12/1990 | Ino et al. | 250/208.1 |
| 4,984,285 | 1/1991 | Kano et al. | 358/461 |

Primary Examiner—David C. Nelms
Assistant Examiner—Michael Messinger
Attorney, Agent, or Firm—Oblon, Spivak, McClelland, Maier & Neustadt

[57] ABSTRACT

A photoelectric conversion device comprises a first voltage source for providing a first predetermined voltage, a photoconductive cell having a first end connected to the first voltage source and a second end, the photoconductive cell being provided so as to receive an optical radiation and having a resistance that is changed in response to the optical radiation supplied to the photoconductive cell, a load resistance having a first end connected to the second end of the photoconductive cell and a second end, a second voltage source connected to the second end of the load resistance for providing thereto a second predetermined voltage that is different from the first predetermined voltage, and threshold detection circuit having an input terminal connected to the second end of the photoconductive cell, wherein the threshold detection circuit has a threshold level and produces a first output signal having a first level when an input signal supplied to the input terminal has a level below the threshold level while producing a second output signal having a second level when the input signal has a level above the threshold level.

9 Claims, 3 Drawing Sheets

PHOTOELECTRIC CONVERSION DEVICE WITH VOLTAGE SOURCE MEANS

BACKGROUND OF THE INVENTION

The present invention generally relates to photoelectric conversion devices and more particularly to a photoelectric conversion device used in the scanners, and the like.

Conventionally, photosensors of the photoconduction type are known wherein amorphous silicon is used as the photoconductive cell. In this type of photosensor, the conductivity of amorphous silicon is changed in response to the optical radiation, and the detection of the optical radiation is made by detecting the change in the electric current flowing through the amorphous silicon. Such a photosensor is characterized by the excellent response that is far superior to the photosensors that use chalcogenides as the photoconductive cell. Thus, the photosensor of the foregoing type is suitable particularly for high speed scanners for reading images at high speed.

In spite of the foregoing various advantages, the photosensor based on amorphous silicon has a problem in that the sensitivity is relatively low due to the small photoconductive current flowing through the amorphous silicon photoconductive cell. In other words, the conventional photosensor of the type described suffers from a problem in that the photosensor easily picks up noise. Further, there is a tendency that the sensitivity is changed device by device. Such a change in the sensitivity should be eliminated, as the change may cause unstable detection of images.

Because of the low sensitivity of the photosensor, one has to use a low noise circuit for the detection circuit to drive the photosensor. However, such a low noise circuit is generally expensive, and increases the cost of the scanner. Further, a large area has been needed in the conventional photosensor for receiving the optical radiation so that the signal-to-noise ratio is increased as much as possible. However, such a large area obviously decreases the integration density when the photosensor is realized as an integrated circuit.

FIG. 1 shows an example of the conventional photoelectric conversion device.

Referring to FIG. 1, the device includes a voltage source 21 for supplying a predetermined voltage, a photoconductive cell 22 of amorphous silicon connected to the voltage source 21 for obtaining electric current therefrom, a load capacitance 23 connected in series to the photoconductive cell 22, and an amplifier 24 connected at a node between the photoconductive cell 22 and the load capacitance 2 for detecting the electric voltage at the node.

When the photoconductive cell of amorphous silicon is used, one can usually obtain a photoconductive current in response to the optical radiation. For example, in response to the optical radiation having the intensity of about 100 lx, a photoconductive current larger by a factor of $10^2$ than the dark current is obtained. However, this ratio between the photoconductive current and the dark current inevitably decreases with increasing integration density of the photosensor because of the reduced area for receiving the optical radiation. Such a decrease in the photoconductive current is the reason why the capacitance 23 is used as the load rather than the load resistance. Further, because of the extremely small magnitude of the current, one has to use an extremely stable voltage source 21 such that there is substantially no noise included in the output voltage applied to the photoconductive cell 22. However, capacitance is not easy to fabricate in integrated circuits as compared to resistors, and thus, the use of the load capacitance 23 causes an increase in the cost of the photosensor. Similarly, the necessity of the stabilized voltage source 21 also contributes to the increased cost of the photosensor.

SUMMARY OF THE INVENTION

Accordingly, it is a general object of the present invention to provide a novel and useful photoelectric conversion device wherein the aforementioned problems are eliminated.

Another object of the present invention is to provide a photoelectric conversion device suitable for construction in a form of integrated circuits.

Another object of the present invention is to provide a photoelectric conversion device constructed in a form of integrated circuit wherein a stable operation can be achieved even when the integration density is increased.

Another object of the present invention is to provide a photoelectric conversion device supplied with an optical radiation for producing an electric signal corresponding to the optical radiation, comprising: a first voltage source for providing a first predetermined voltage; a photoconductive cell having a first end connected to the first voltage source and a second end, said photoconductive cell being provided so as to receive an optical radiation and having a resistivity that is changed in response to the optical radiation supplied to the photoconductive cell; a load resistance having a first end connected to the second end of the photoconductive cell and a second end; a second voltage source connected to the second end of the load resistance for providing thereto a second predetermined voltage that is different from the first predetermined voltage; a first driving voltage source for providing a first source voltage; a second driving voltage source for providing a second source voltage which is different from the first source voltage; a first metal-oxide-silicon (MOS) transistor of one of p-channel and n-channel types, said first MOS transistor having a source connected to the first driving voltage source, a gate connected to the second end of the photoconductive cell, and a drain; a second MOS transistor of the other of the p-channel and the n-channel types, said second MOS transistor having a drain connected to the drain of the first MOS transistor, a gate connected to the second end of the photoconductive cell, and a source connected to the second driving voltage source; and an output terminal connected to the drain of the first MOS transistor for outputting an electric signal in response to the optical radiation supplied to the photoconductive cell.

According to the present invention, the first and second MOS transistors form a complementary metal-oxide-silicon (CMOS) inverter circuit characterized by a threshold operation. More specifically, the output electric signal at the output terminal of the CMOS inverter circuit causes a transition from a first state to a second state in response to when the voltage at the second end of the photoconductive cell has exceeded a predetermined threshold voltage. It should be noted that the voltage at the second end of the photoconductive cell becomes stationary after a predetermined time necessary for charging or discharging the capacitance at the gate of the MOS transistors or other parasitic capacitance. Thereby, a stable, binary output is obtained in response to the detection of the optical radiation.

As the output terminal of the CMOS inverter is connected to the first and second driving voltage sources via the MOS transistors, a large output current is obtained at the output terminal of the CMOS inverter via the MOS transistor that is turned on. It should be noted that the MOS transistors in the CMOS inverter has a very small resistance when they are turned on. Thus, the photoelectric conversion device of the present invention is capable of providing a large output current sufficient for driving devices at the subsequent stages.

In a preferred embodiment of the present invention, there is provided means for changing the second source voltage relative to the first source voltage. Thereby, the intensity of the optical radiation that causes the transition of state of the CMOS inverter is changed. In other words, the photoelectric conversion device of the present invention can detect various level of the input optical radiation. When the photoelectric conversion device is used for an image scanner, the image scanner can detect the gradation of images.

Other objects and further features of the present invention will become apparent from the following detailed description when read in conjunction with the attached drawings.

DETAILED DESCRIPTION

First, the photoconductive cell used in the photoelectric conversion device of the present invention will be described with reference to FIG. 2.

Figure 2:
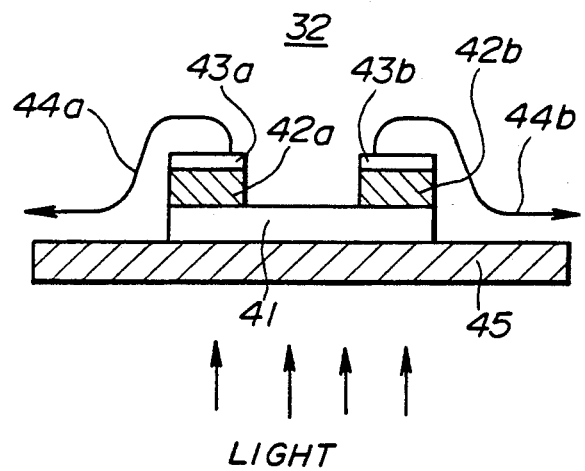
FIG. 2 is a diagram showing the construction of a photoconductive cell used in the photoelectric conversion device of the present invention.

Referring to FIG. 2 showing a photoconductive cell 32, the photoconductive cell 32 is constructed on a transparent substrate 45 such as a glass and includes an undoped amorphous silicon layer 41 deposited on a top surface of the substrate 45. It should be noted that the transparent substrate 45 has a bottom surface to which an incident input optical radiation LIGHT is directed.

In response to the optical radiation, electrons at the valence band of the amorphous silicon are excited to the conduction band and the amorphous silicon layer shows a photoconduction effect.

On the undoped amorphous silicon layer 41, amorphous silicon contact layers 42a and 42b, both doped to the n+-type, are provided, and chromium electrodes 43a and 43b are provided respectively on the amorphous silicon contact layers 42a and 42b. Thereby, the chromium electrodes 43a and 43b establish an excellent ohmic contact with the amorphous silicon layer 41 via the contact layers 42a and 42b.

The chromium electrodes 43a and 43b are connected respectively to lead wires 44a and 44b. Thus, in response to the incident optical radiation LIGHT at the bottom of the substrate 45, an electric current can flow from the lead 44a to the lead 44b or from the lead 44b to the lead 44a, provided that there is a suitable biasing.

Figure 3:
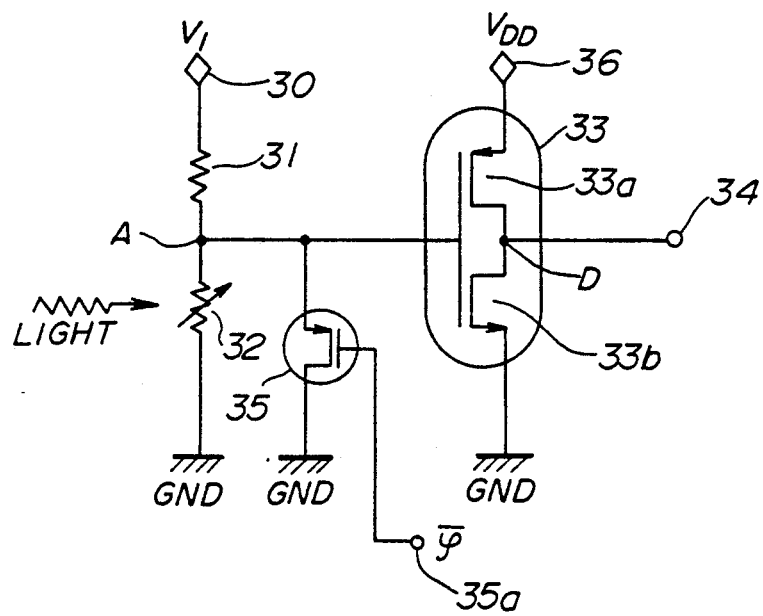
FIG. 3 is a circuit diagram showing the construction of the photoelectric conversion device according to a first embodiment of the present invention.

FIG. 3 shows the circuit diagram of the photoelectric conversion device according to a first embodiment of the present invention wherein the photoconductive cell of FIG. 2 is employed.

Referring to FIG. 3, the photoelectric conversion device includes a fixed resistor 31 having a first end connected to a voltage source 30 that provides a fixed voltage $V_1$ and a second end connected, at a node A, to the lead 44a of the photoconductive cell 32 of FIG. 2. The lead 44b of the cell 32, in turn, is connected to the ground.

Further, there are provided p-channel MOS transistor 33a and n-channel MOS transistor 33b connected in series, wherein the transistor 33a has a source connected to a voltage source 36 providing a driving voltage $V_{DD}$ and a drain connected to a drain of the transistor 33b at a node D. The transistor 33b in turn has a source connected to the ground. The transistors 33a and 33b have respective gates that are connected commonly to the node A. Thereby, the transistors 33a and 33b form a CMOS inverter circuit 33. Further, an output terminal 34 is connected to the node D.

In addition to the transistors 33a and 33b forming the CMOS inverter 33, there is provided another p-channel MOS transistor 35 such that the transistor 35 has a source connected to the node A, a gate connected to an input terminal 35a to which a reset pulse is applied, and a source connected to the ground, for resetting the voltage level at the node A as will be described.

In operation, in response to the optical radiation incident at the bottom surface of the substrate 45, the resistivity of the photoconductive cell 32 is reduced. In the typical example wherein the amorphous silicon layer 41 has a thickness of about 1 micron and the photoconductive cell 32 has a length that is larger than a width by a factor of 50, a resistance of about $10^7$ ohms is obtained when the cell 32 is irradiated with an optical radiation of 100 1x. On the other hand, when there is no incident optical radiation, the cell 32 has a resistance of about $10^9$ ohms. By choosing the value of the resistance 31 at about $10^8$ ohms, there appears a voltage of $0.91 \times V_1$ at the node A when there is no incident optical radiation while there appears a voltage of $0.09 \times V_1$ at the node A when there is such an incident optical radiation.

This change in the voltage level at the node A is detected by the CMOS circuit 33. More specifically, when there is no incident optical radiation, the photoconductive cell 32 has the foregoing large resistance and the p-channel transistor 33a is turned off while the n-channel transistor 33b is turned on. In response thereto, the voltage level at the node D is decreased to the level of the ground and the output signal obtained at the output terminal assumes a low level state. When an incident optical radiation comes in, the photoconductive cell 32 decreases its resistivity and the voltage level at the node A is decreased as already described. With the decrease in the voltage level at the node A, the electric charges accumulated in the gate capacitance or other parts of the transistors 33a and 33b are dissipated to the ground quickly through the photoconductive cell 32. When the voltage level has decreased below the predetermined threshold voltage, the transistor 33a is turned on and the transistor 33b is turned off. Thereby, the voltage level at the node D is increased to a voltage level close to $V_{DD}$ and the output signal at the output terminal 34 changes it state from the low level state to the high level state.

As long as the voltage level at the node A is below the threshold voltage, the state of the output signal at the output terminal 34 remains unchanged, even when the intensity of the incident optical beam has been changed. In other words, the output electric signal at the output terminal 34 is held constant, and circuits that follow the photoelectric conversion device can use the signal at the output terminal 34 by sampling in response to or in synchronization with a clock signal provided with a suitable timing. Thereby, a stable detection of the incident optical radiation can be achieved. Further, the construction of FIG. 3 allows one to take out a large output current from the voltage source 36 or from the ground via the transistor 33a or 33b that is turned on. Thus, an output power sufficient to drive the circuit devices that follow the photoelectric conversion device is obtained easily.

The transistor 35 is used to reset the voltage level at the node A at the ground level when the photoelectric conversion device is in the stand-by state waiting for the operation for detecting the incident optical radiation. Thus, the transistor 35 is turned on in response to the low level of the signal at the input terminal 35a during the standby state. In response to the turning-on of the transistor 35, the output of the CMOS inverter 33 is held at the high level. When the device is activated, the signal changes its state to the high level state and the transistor 35a is turned off. Thereby, the detection operation described already is performed.

Next, a second embodiment of the present invention will be described with reference to FIG. 4. In the drawing, the parts described already are given identical reference numerals and the description thereof will be omitted.

In the photoelectric conversion device of the first embodiment, there is a problem in that the device cannot detect the gradation of the images because of the threshold operation for discriminating the input image at the threshold level of the CMOS inverter 33. In the actual applications, there often arises a case that the photoelectric conversion device is required to have the capability of detecting the gradation level of the images.

One possible approach to do this would be to provide a number of CMOS inverter circuits having different threshold levels for each of the photoelectric conversion devices. However, such an approach is not acceptable, not only because of the increased number of parts needed for constructing the device but also because of the difficulty in fabricating the MOS transistors used for the CMOS inverter with satisfactorily controlled threshold voltage. An alternative approach would be to change the source voltage $V_{DD}$ to the CMOS inverter circuit for detection of each level of the grading. This approach, however, is not desirable as it requires detection of the source voltage $V_{DD}$, and for this purpose, comparison means has to be provided. Provision of such comparison means would complicate the circuit construction of the photoelectric conversion device.

There is a third approach wherein the voltage $V_1$ is changed in correspondence to the gradation level of the image to be detected. According to this approach, there is provided means for changing the voltage level $V_1$ in response to the level of the gradation to be detected.

Figure 4:
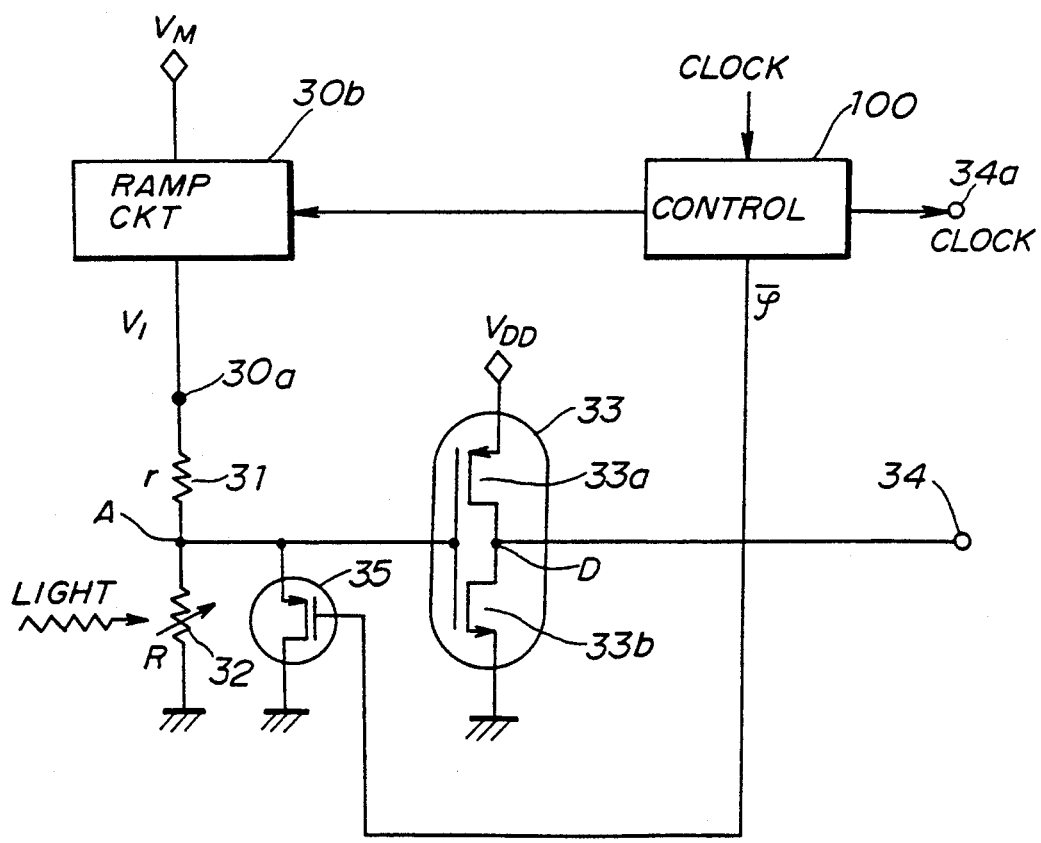
FIG. 4 is a circuit diagram showing the construction of the photoelectric conversion device according to a second embodiment of the present invention.

FIG. 4 shows a second embodiment of the present invention for performing the detection of the gradation level. In FIG. 4, the parts corresponding to those already described with reference to FIG. 3 are given identical reference numerals and the description thereof will be omitted.

Figure 1:
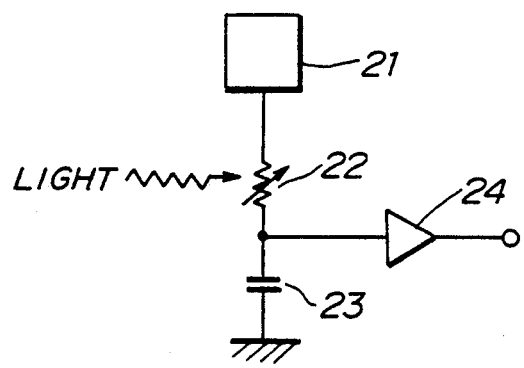
FIG. 1 is a block diagram showing the construction of a typical conventional photoelectric conversion device.

Referring to FIG. 4, there is provided a ramp circuit 30b having one end connected to a main voltage source $V_M$, and another end connected to a voltage source terminal 30a corresponding to the voltage source 30 of FIG. 1. This ramp circuit 30b produces a variable output voltage at the terminal 30a under control of a controller 100 such that the output voltage changes linearly with time.

More specifically, the controller 100 is supplied with a clock signal and the circuit 30b is operated in response to the clock signal. As a result, the voltage $V_1$ at the node A is changed linearly and time-sequentially. Thereby, the threshold level for detecting the intensity of the incident light is changed time-sequentially and the detection of the image for various grading levels is performed.

Next, the change in the voltage $V_1$ caused under the control of the controller 100 will be described.

Designating the resistance of the resistor 31 as r and the resistance of the photoconductive cell 32 as R, the voltage level $V_A$ at the node A is represented as $$V_A = V_1/(1+r/R) = V_1/(1+B) \tag{1}$$

where $\beta = r/R$. In the present embodiment, the value of $\beta$ is changed from 0.1 for the case of there is no incident light to 10 for the case where there is an incident light.

By setting the threshold level of the CMOS inverter 32 to $V_{DD}/2$, the CMOS inverter 32 produces a high level output when the voltage $V_A$ is less than $V_{DD}/2$. On the other hand, when the voltage $V_A$ exceeds $V_{DD}/2$, the output of the CMOS inverter 33 assumes the low level state.

In the case that the voltage $V_1$ is chosen to satisfy the following relation $$V_1/11 < V_{DD}/2 < 16V_1/166, \tag{2}$$

then, the CMOS inverter 33 produces the high level output when $\beta$ is equal to or larger than 10. When $\beta$ is set as $\beta \leq 10 \times 15/16 = 150/16$, then the inverter 33 produces the low level output.

In the case when the voltage $V_1$ is chosen to satisfy the relation $$16V_1/166 < V_{DD}/2 < 16V_1/156 \tag{3},$$

the CMOS inverter 33 produces the high level output when the parameter $\beta$ is equal to or larger than 156/16, while the inverter 33 produces the low level output when the parameter $\beta$ is equal to or smaller than 140/16.

Thus, by repeatedly changing the voltage $V_1$, it becomes possible to detect 16 different grading levels corresponding to $\beta = 10, 10 \times 15/16, 10 \times 14/16, \ldots, 10 \times 1/16$.

In the case when the voltage $V_{DD}$ is set at 12 volts, the voltage $V_1$ represented in volts for realizing the foregoing grading level detection is determined as follows.

| | | |
|---|---|---|
| $66 > V_1 > 62.25$ | (4) |
| $62.25 > V_1 > 58.5$ | (5) |
| $58.5 > V_1 > 54.75$ | (6) |
| $54.75 > V_1 > 51$ | (7) |
| $51 > V_1 > 47.25$ | (8) |
| $47.25 > V_1 > 43.5$ | (9) |
| $43.5 > V_1 > 39.75$ | (10) |
| $39.75 > V_1 > 36$ | (11) |
| $36 > V_1 > 32.25$ | (12) |
| $32.25 > V_1 > 28.5$ | (13) |
| $28.5 > V_1 > 24.75$ | (14) |
| $24.75 > V_1 > 21$ | (15) |
| $21 > V_1 > 17.25$ | (16) |
| $17.25 > V_1 > 13.5$ | (17) |
| $13.5 > V_1 > 9.75$ | (18) |
| $9.75 > V_1$ | (19) |

The foregoing relation of the voltage $V_1$ and the gradation level is formulated for more general case as follows.

Designating the parameter $\beta$ as $$\beta = xy/16, \tag{20}$$

where y represents the ratio between the resistance of the resistor 31 and that of the resistor 32 under the illuminated state, and x represents a parameter that changes its value from 1–16 in correspondence to the 16 gradation levels, the generalized equation corresponding to the foregoing Eq. (2) is represented as:

$$16V_1/(xy+16) < V_{TH} < 16V_1/[(x-1)y+16]. \tag{21}$$

After a modification, Eq. (21) is rewritten as $$[(xy+16)/16]V_{TH} > V_1 > [[(x-1)y+16]/16\, V_{TH} \tag{22}$$

It should be noted that, in the foregoing case of Eqs.(4)–(19), the parameter y is set to 10 and the parameter x is changed from 16 to 1.

Next, the tolerable margin of the voltage $V_1$ will be examined.

Eq. (21) can be rewritten as $$16V_1/(xy+16) < V_{TH}' \tag{23-a}$$

$$V_{TH}'' < 16V_1/[(x-1)y+16] \tag{23-b}$$

$$V_{TH}' = V_{TH} - \Delta V_{TH}/2 \tag{24-a}$$

$$V_{TH}'' = V_{TH} + \Delta V_{TH}/2 \tag{24-b}$$

Using the notations in Eqs. (23-a), (23-b), (24-a) and (24-b), Eq. (22) can be written as:

$$[(xy+16)/16]V_{TH}' > V_1 > [[(x-1)y+16]/16 V_{TH}''. \tag{25}$$

In order that the inequality (25) has a meaningful solution, the following relation has to be satisfied:

$$0 < [(xy+16)/16]V_{TH}' - [[(x-1)y+16]/16\,]V_{TH}''$$
$$= [y(V_{TH} - \Delta V_{TH}/2) + (y-xy-16)\Delta V_{TH}]/16 \tag{26}$$

Solving Eq. (26), one obtains the following relation that provides the tolerable margin of the threshold voltage:

$$\Delta V_{TH} < [y/(xy+16-y/2)]V_{TH} \tag{27}$$

In other words, the detection of the grading level is performed correctly using the photoelectric conversion circuit of FIG. 4, as long as the variation in the threshold voltage level of the CMOS inverter 33 falls within the range defined by Eq. (27).

Figure 5:
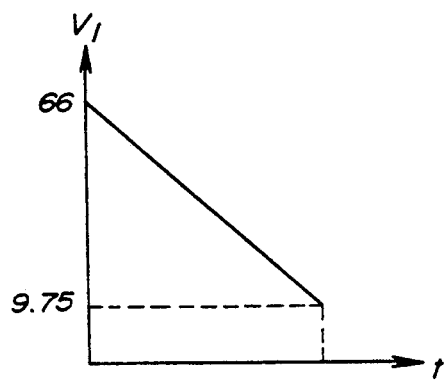
FIG. 5 is a graph showing a change of voltage with time used in the photoelectric conversion device of the second embodiment for achieving a characteristic to detect the gradation of images.

FIG. 5 shows the change in the voltage $V_1$ caused in accordance with Eqs.(4)–(19). As will be seen, the voltage $V_1$ decreases linearly with increasing time t. Thus, when the output at the output terminal 34 is sampled in synchronization with the clock to the controller 100, one can detect the transition of state of the CMOS inverter 33 that is caused in correspondence to a particular gradation level. In other words, the gradation level of the input image is detected in combination of the output at the terminal 34 and the clock which is outputted at an output terminal 34a.

Figure 6:
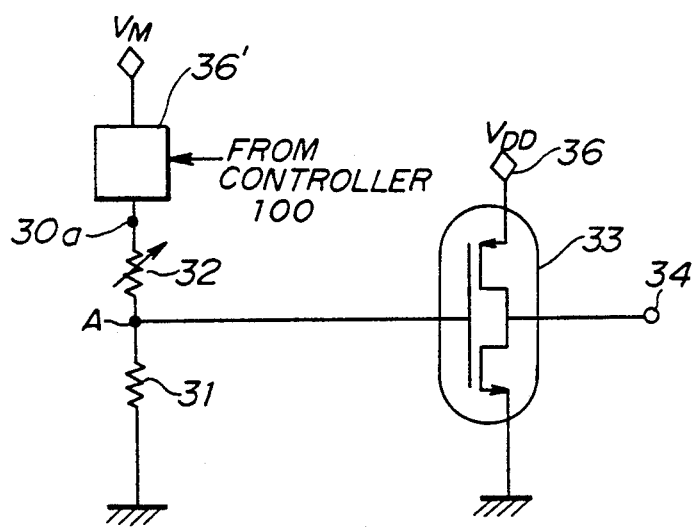
FIG. 6 is a circuit diagram showing a third embodiment of the present invention.

FIG. 6 shows a third embodiment of the present invention which is a modification of the device of FIG. 4. In this modification, the position of the photoconductive cell 32 and the resistor 32 is interchanged. In this case, too, the voltage $V_1$ at the node A is changed by a voltage source circuit 36' which produces the output voltage $V_1$ at the terminal 30a under the control of the controller 100.

In the circuit of FIG. 6, it should be noted that the CMOS inverter 3 produces the low level output when there is no incident optical radiation and the high level output when there is the incident optical radiation.

In this case, the voltage $V_A$ at the node A is represented as $$V_A = \beta/(1+\beta)V_1 = [1 - 1/(1+\beta)]V_1 \tag{28}$$

where $\beta$ is represented as $\beta = r/Rs$.

Here, the parameter $\beta$ is represented as $$\beta = xy/16, \tag{29}$$

similarly to the foregoing embodiment. The meaning of the parameters x and y are the same as in the case of Eq. (20).

Then, the following inequality is derived in correspondence to Eq. (21):

$$[xy/(16+xy)]V_1 > V_{TH} > [(x-1)y/[16+(x-1)y]]V_1. \tag{30}$$

Similarly, the following inequality is derived in correspondence to Eq. (22):

$$[(16+xy)/xy]V_{TH} < V_1 < [[16+(x-1)y]/(x-1)y]V_{TH} \tag{31}$$

Using the inequality (31), one can calculate the actual value of $V_1$ as follows:

| | | |
|---|---|---|
| $6.6 < V_1 < 6.64$ | (32) |
| $6.64 < V_1 < 6.69$ | (33) |
| $6.69 < V_1 < 6.74$ | (34) |
| $6.74 < V_1 < 6.8$ | (35) |
| $6.8 < V_1 < 6.87$ | (36) |
| $6.87 < V_1 < 6.96$ | (37) |

-continued

| | | |
|---|---|---|
| 6.96 < V₁ < 7.07 | (38) | |
| 7.07 < V₁ < 7.2 | (39) | |
| 7.2 < V₁ < 7.37 | (40) | |
| 7.37 < V₁ < 7.6 | (41) | |
| 7.6 < V₁ < 7.92 | (42) | |
| 7.92 < V₁ < 8.4 | (43) | |
| 8.4 < V₁ < 9.2 | (44) | |
| 9.2 < V₁ < 10.8 | (45) | |
| 10.8 < V₁ < 15.6 | (46) | |
| 15.6 < V₁ | (47) | | wherein the parameter x is changed from 1 to 16 and the parameter y is set at 10.

Further, the noise margin for the present embodiment is given as follows.

By rewriting Eq. (30) as $$[xy/(16+xy)]V_1 > V_{TH}'' \quad (48\text{-a})$$

$$V_{TH}'' > (x-1)y/[16+(x-1)y] \quad (48\text{-b})$$

$$V_{TH}' = V_{TH} + \Delta V_{TH}/2 \quad (49\text{-a})$$

$$V_{TH}'' = V_{TH} - \Delta V_{TH}/2 \quad (49\text{-b}),$$

Eq. (31) is modified as follows:

$$[(16+xy)/xy]V_{TH}' < V_1 < [[16+(x-1)y]/(x-1)y]V_{TH}'' \quad (50)$$

From the condition that the inequality (50) has a solution, one obtain the relation $$0 > [(16+xy)/xy]V_{TH}' - [[16+(x-1)y]/(x-1)y]V_{TH}'' \quad (51)$$

from which the relation defining the tolerable margin $\Delta V_{TH}$ is given as $$\Delta V_{TH} < 16V_{TH}/(16x + x^2y - xy - 8) \quad (52)$$

In this case, therefore, the detection of the gradation level is achieved when the variation in the threshold voltage level of the CMOS inverter circuit 33 is held within the range defined by Eq. (53).

Figure 7:
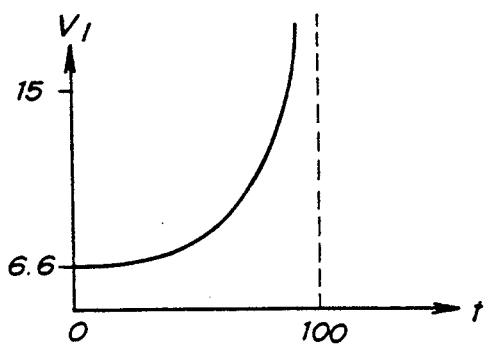
FIG. 7 is a graph showing the change in the voltage with time, used in the third embodiment.

As will be understood from Eq. (51), the voltage V₁ is changed according to a hyperbolic function when detecting the gradation level. FIG. 7 shows an example of the voltage V₁ which is changed with time in response to the clock signal supplied to the controller 100. Similarly to the case of the second embodiment, the detection of the gradation level can be achieved by sampling the output signal at the output terminal 34 in synchronization with the clock signal. The voltage change shown in FIG. 7 may be represented as $$V(t) = [100/(100-t) + 1]V_{TH} \quad (53).$$

In this case, the voltages in Eqs. (32)–(47) can be obtained by sampling the output at the terminal 34 with an interval of every 6.25 unit, starting from t=3, wherein the unit of the time herein is an arbitrary unit and normalized to 100.

Further, the present invention is not limited to the embodiments described heretofore, but various variations and modifications may be made without departing from the scope of the invention.

What is claimed is:

1. A photoelectric conversion device supplied with an optical radiation for producing an electric signal corresponding to the optical radiation, comprising:

first voltage source means for providing a first predetermined voltage;

a photoconductive cell having a first end connected to the first voltage source and a second end, said photoconductive cell being provided so as to receive an optical radiation and having a resistance that is changed in response to the optical radiation supplied thereto;

a load resistance having a first end connected to the second end of the photoconductive cell and a second end;

second voltage source means connected to the second end of the load resistance for providing thereto a second predetermined voltage that is different from the first predetermined voltage; and threshold detection means having an input terminal connected to the second end of the photoconductive cell, said threshold detection means having a threshold level and producing a first output signal having a first level when an input signal supplied to the input terminal has a level below the threshold level while producing a second output signal having a second level when the input signal has a level above the threshold level.

2. A photoelectric conversion device as claimed in claim 1 in which said threshold detection means comprises a first driving voltage source for providing a first source voltage, a second driving voltage source for providing a second source voltage which is different from the first source voltage, a first metal-oxide-silicon (MOS) transistor of one of p-channel and n-channel types, said first MOS transistor having a source connected to the first driving voltage source, a gate connected, as the input terminal, to the second end of the photoconductive cell, and a drain, a second MOS transistor of the other of the p-channel and the n-channel types, said second MOS transistor having a drain connected to the drain of the first MOS transistor, a gate connected, as the input terminal, to the second end of the photoconductive cell, and a source connected to the second driving voltage source, and an output terminal connected to the drain of the first MOS transistor for outputting either one of the first and second output signals as an electric signal in response to the optical radiation supplied to the photoconductive cell.

3. A photoelectric conversion device as claimed in claim 1 in which said first and second voltage source means provide the first and second predetermined voltages set such that the change in the resistance of the photoconductive cell in response to the reception of the incident optical beam causes a transition in state of the electric signal at the output terminal.

4. A photoelectric conversion device as claimed in claim 1 further comprising control means supplied with a clock signal for controlling the second voltage source means such that the second predetermined voltage is changed in response to the clock signal.

5. A photoelectric conversion device as claimed in claim 4 in which said control means changes the second predetermined voltage linearly with time.

6. A photoelectric conversion device as claimed in claim 4 in which said control means changes the second predetermined voltage according to an equation $$[(xy+16)/16]V_{TH} > V_1 > [[(x-1)y+16]/16]V_{TH}$$

where x stands for a parameter which is changed time-sequentially from 1 to 16 with an increment of 1, y stands for a ratio of resistance defined as the resistance of the load resistance divided by the resistance of the photoconductive cell under presence of the incident optical radiation, $V_1$ stands for an initial value of the second predetermined voltage at an initial state wherein the parameter x is zero, and $V_{TH}$ stands for the threshold voltage of the threshold detection means.

7. A photoelectric conversion device as claimed in claim 1 further comprising control means supplied with a clock signal for controlling the first voltage source means such that the first predetermined voltage is changed in response to the clock signal.

8. A photoelectric conversion device as claimed in claim 7 in Which said control means changes the second predetermined voltage with time according to a hyperbolic curve.

9. A photoelectric conversion device as claimed in claim 7 in which said control means changes the first predetermined voltage according to an equation $$[(xy+16)/xy]V_{TH} < V_1 < [[(x-1)y+16[/[(x-1)y]]V_{TH}$$

where x stands for a parameter which is changed time-sequentially from 1 to 16 with an increment of 1, y stands for a ratio of resistance defined as the resistance of the load resistance divided by the resistance of the photoconductive cell under presence of the incident optical radiation, $V_1$ stands for an initial value of the second predetermined voltage at an initial state wherein the parameter x is zero, and $V_{TH}$ stands for the threshold voltage of the threshold detection means.

* * * * *